United States Patent
Löwe et al.

(10) Patent No.: US 8,911,851 B2
(45) Date of Patent: Dec. 16, 2014

(54) LATENT-REACTIVELY GLUED TPU/PC LAYER MATERIALS

(75) Inventors: Reinhard Löwe, Werder Ot Phöden (DE); Per Krüger, Berlin (DE); Michael Knebel, Berlin (DE); Jens Ehreke, Berlin (DE); Heinz Pudleiner, Krefeld (DE); Mehmet-Cengiz Yesildag, Leverkusen (DE); Klaus Meyer, Dormagen (DE); Dirk Pophusen, Bergisch-Gladbach (DE); Jörg Büchner, Bergisch-Gladbach (DE)

(73) Assignee: Bayer MaterialScience AG (DE)

( * ) Notice: Subject to any disclaimer, the term of this patent is extended or adjusted under 35 U.S.C. 154(b) by 831 days.

(21) Appl. No.: 13/125,077

(22) PCT Filed: Jul. 20, 2009

(86) PCT No.: PCT/DE2009/000996
§ 371 (c)(1),
(2), (4) Date: Apr. 20, 2011

(87) PCT Pub. No.: WO2010/045902
PCT Pub. Date: Apr. 29, 2010

(65) Prior Publication Data
US 2011/0274883 A1 Nov. 10, 2011

(30) Foreign Application Priority Data
Oct. 21, 2008 (DE) .......................... 10 2008 052 572

(51) Int. Cl.
*B32B 3/00* (2006.01)
*B29C 65/00* (2006.01)
*B42D 15/00* (2006.01)
*G06K 19/077* (2006.01)

(52) U.S. Cl.
CPC .................................. *G06K 19/07745* (2013.01)
USPC .............. 428/172; 283/107; 156/60; 156/285

(58) Field of Classification Search
CPC ............... B32B 2425/00; B42D 15/00; B42D 15/0013; B42D 15/10; B42D 15/105; B42D 2031/00; B42D 2031/20; B42D 2031/22; B42D 2031/24; B42D 2033/00; B42D 2033/46; B42D 2033/30; B42D 2033/04; B42D 2033/06
USPC ........ 428/172, 914; 283/72, 83, 86, 107, 109, 283/904; 235/488; 359/2, 576; 156/60, 285
See application file for complete search history.

(56) References Cited

U.S. PATENT DOCUMENTS

| | | | |
|---|---|---|---|
| 6,348,548 B1 | 2/2002 | Abend | |
| 6,506,280 B2* | 1/2003 | Ganster et al. | 156/331.4 |
| 2003/0127847 A1* | 7/2003 | Keller et al. | 283/109 |
| 2006/0202795 A1 | 9/2006 | Hoeppner et al. | |

FOREIGN PATENT DOCUMENTS

EP 0922720 A1 6/1999

* cited by examiner

*Primary Examiner* — Catherine A Simone
(74) *Attorney, Agent, or Firm* — Drinker Biddle & Reath LLP

(57) ABSTRACT

A document (2) containing:
  electronic components (14) and/or diffractive security elements;
  at least one protective layer (4, 5) being arranged on one side or two protective layers (4, 5) being arranged on both sides of the electronic components (14) and/or of the diffractive security element, said protective layers being formed of a first base polymer,
  polymer layers (8, 9, 12, 13), being formed of a second base polymer being different from the first base polymer, into which the electronic components (14) and/or the diffractive security element with the protective layers (4, 5) are laminated; and
adhesive layers with a latent-reactive adhesive (10, 11) being arranged at least between the polymer layers (8, 9, 12, 13) and the protective layers (4, 5), and wherein the core layer or protective layers are formed of a thermoplastic elastomer.

22 Claims, 1 Drawing Sheet

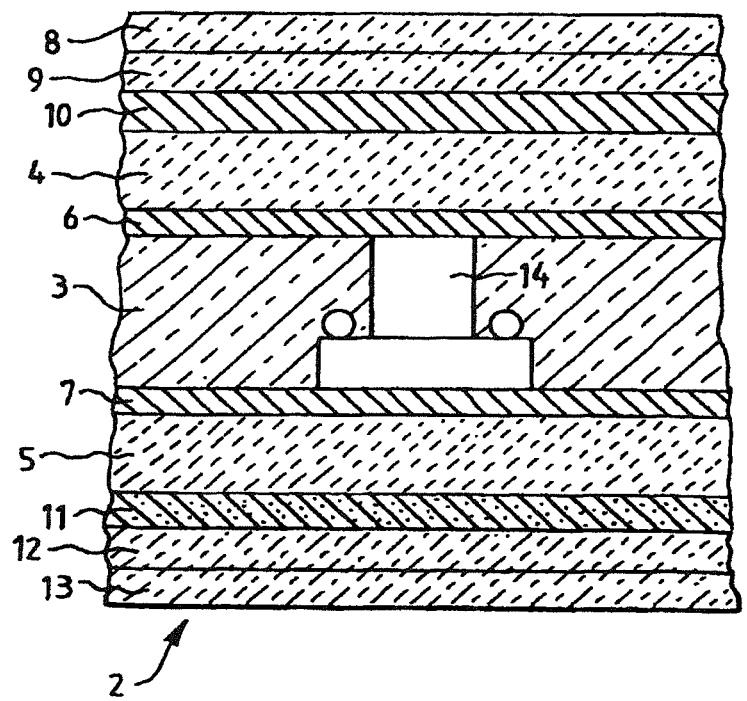

LATENT-REACTIVELY GLUED TPU/PC LAYER MATERIALS

PRIORITY

Priority is claimed as a national stage application, under 35 U.S.C. §371, to PCT/DE2009/000996, filed Jul. 20, 2009, which claims priority to German application 102008052572.3, filed Oct. 21, 2008. The disclosures of the aforementioned priority applications are incorporated herein by reference in their entirety.

FIELD OF THE INVENTION

The invention relates to a security and/or valuable document comprising an inlay, which includes a core layer, the electronic components, and/or diffractive security elements, and polymer layers, into which the inlay is laminated. The invention further relates to a method for producing such a security and/or valuable document

BACKGROUND OF THE INVENTION

Security and/or valuable documents, such as identity cards, passports, access allowance cards, visas, tickets, driver licenses, vehicle documents, personalized valuables, credit cards, or personalized chip cards increasingly comprise electronic circuits and other active and passive electronic components, such as integrated semiconductors (ICs), but also chip modules, displays, batteries, coils, capacitors, contact spots etc.

When integrating such components in a card composite, for instance for thin semiconductor structures, the problem of the premature destruction or reduction of life of the component during the lamination by thermal and mechanical overload or load is encountered. With known methods, for instance for manufacturing polycarbonate (PC) Smart Cards during the lamination of individual film layers, a PC film is directly positioned over the chip. In the industrially established procedure, the prepared card structures are compressed, with simultaneous exposure to temperature and pressure, so to form a "quasi-monolithic" block. Since PC due to its specific heat transfer coefficient and its relatively high glass temperature $T_g$ does not immediately flow sufficiently well, there is directly at the chip an increased mechanical pressure, which in most cases will lead to the mechanical destruction of the chip.

For avoiding this problem, it is known in the art to apply on the electronic components self-adhesive or elastic protective layers, in most cases thermoelastic and/or thermoplastic protective layers, for instance thermoplastic polyurethane (TPU), whereby the PC films with interposed components, such as chips, can be joined without a high risk of destruction for the component so to form a card. Normally, these adhesive layers are however a point of weakness of the card structure. Through the edge of the card, water vapor and air can more easily diffuse in and thus lead to a later delamination. Other environmental effects, too, in particular high temperatures, but also fast temperature changes may lead to that the card is split and therefore cannot be used anymore.

Moreover, self-adhesive films having a thickness <50 μm are difficult to handle or not at all on an industrial scale and are inflexible, if e.g. cavities are to be filled up. Similar considerations apply for components with diffractive structures, e.g. volume holograms. If the hologram is directly laminated with other PC films so to form a card, this occurs in certain cases under losses being quantifiable visually and by machine of the display quality of the hologram, in particular of the colors and of the 3-dimensional appearance. Most volume holograms based on photopolymer namely have a softening point or a glass temperature $T_g$ of clearly below 150° C. If during the lamination the PC films being still hard at the beginning are pressed onto the soft photopolymer of the hologram, the Bragg planes are shifted, and certain elements appear shifted in wavelength. For instance, green picture elements become yellow picture elements, etc. Especially for volume holograms, further, the 3-dimensional impression is distinctly reduced, and the holograms appear rather flat and 2-dimensional and washed out. These effects, too, are based on the problem that the "hard" PC either comes on brittle faces and causes mechanical stress, or deforms softer objects, for instance of a photopolymer, whereby these components are impaired in their operation.

However, the base polymers used for the protective layers have different structures from the polycarbonate preferred for the other polymer layers, so that a substance-to-substance connection is sometimes not achieved during the lamination. There is, therefore, here too the risk of delamination. Consequently, there is an increased risk of counterfeit and/or manipulation, since the inlay can possibly be removed in a non-destructive manner and can be incorporated in a different layer composite, a counterfeit. Furthermore, data that the inlay carries or comprises can be manipulated.

From other technological sectors, latent-reactive adhesives are known in the art, and as an example only reference is made to the document EP 0 922 720 A1.

BRIEF SUMMARY OF THE INVENTION

It is therefore the technical object of the invention to specify a security and/or valuable document, which on one hand has a reduced risk of damage to the integrated electronic components during production, and on the other hand a smaller risk of delamination.

BRIEF DESCRIPTION OF THE DRAWINGS

FIG. 1 illustrates a diagrammatical representation of a security and/or valuable document produced according to the invention.

DETAILED DESCRIPTION OF THE INVENTION

For achieving this technical object, the invention teaches a security and/or valuable document comprising electronic components and/or diffractive security elements, at least one protective layer being arranged on one side or two protective layers being arranged on both sides of the electronic components and/or of the diffractive security element, said protective layers being formed of a first base polymer, polymer layers being formed of a second base polymer being different from the first base polymer, into said polymer layers the electronic components and/or the diffractive security element with the protective layers being laminated, adhesive layers with a latent-reactive adhesive being arranged at least between the polymer layers and the protective layers.

Latent-reactive adhesives per se are known in many different ways. For this purpose, for instance reference is made to the document EP 0 922 720. According thereto, they are substantially aqueous dispersions with at least one surface-deactivated polyisocyanate and at least one polymer reactive with isocyanate.

The deactivated polyisocyanates have reaction temperatures in the range from 30° C. to 180° C., in particular 40° C. to 150° C. The melting points thereof are in the range from 40° C. to 150° C.

As polyisocyanates (this term also includes diisocyanates), aliphatic, cycloaliphatic, heterocyclic or aromatic polyisocyanates are suitable, for instance diphenylmethane-4,4'-diisocyanate, naphthalene-1,5-diisocyanate, 3,3'-dimethyl-biphenyl-4,4'-diisocyanate, dimeric 1-methyl-2,4-phenylene-diisocyanate, 3,3'-diisocyanate-4,4'-dimethyl-N,N'-diphenylurea, the addition product of 2 moles 1-methyl-2,4-phenylene-diisocyanate with 1 mole 1,2-ethandiol, 1,4-butandiol, 1,4-cyclohexan-di-methanol, or ethanolamine, the isocyanurate of the IPDI. In the case of the mentioned addition products, the reaction temperature is below 90° C.

Reaction partners of the polyisocyanates may be water-soluble or water-dispersible emulsion or dispersion polymers, which carry isocyanate-reactive groups, such as for instance hydroxyl, amino, carboxyl, or carbon amide groups. In these polymers, the proportion of monomers with isocyanate-reactive groups typically is in the range from 0.2 to 15 wt. %, in particular 1 to 8 wt. %, referred to the polymer. Examples of suitable monomers are: allyl alcohol, hydroxyethyl or hydroxypropyl acrylate and methacrylate, butandiol monoacrylate, ethoxylated or propoxylated acrylates or methacrylates, N-methylol acrylamide, tert butyl amino ethyl methacrylate, acrylic, and methacrylic acid, maleic acid, maleic acid monoester. Furthermore, the copolymerization of glycidyl methacrylate and/or allyl glycidyl ether is possible. They contain an epoxy group, which is derivatized in a further step with amines or amino alcohols to a secondary amine, for instance with ethylamine, ethyl hexylamine, isononylamine, aniline, toluidine, xylidine, benzylamine, ethanolamine, 3-amino-1-propanol, 1-amino-2-propanol, 5-amino-1-pentanol, 6-amino-1-hexanol, 2-(2-aminoethoxy) ethanol. Suitable are further water-soluble binding agents, such as polyvinyl alcohol, partially hydrolyzed polyvinyl acetate, hydroxyethyl cellulose, hydroxypropyl cellulose, or also water-dispersible hydroxy-functional polyesters, hydroxy-functional sulfo-polyesters, and polyurethane dispersions, dispersions of polyamidoamines, which carry carboxyl-hydroxyl-primary or secondary amino groups. Further, aqueous colloidal dispersions or colloidal solutions with particle sizes between 1 and 100 nm based on thermoplastic polymers with isocyanate-reactive groups, such as for instance (higher-molecular) solid epoxy resins, poly-ethylene-vinyl alcohol or polyethylene-co-acryl acid can be used.

The ratio of the isocyanate groups to the sum of the isocyanate-reactive groups, such as hydroxy or amino, is suitably in the range from 0.1 to 1.5.

Means for the surface deactivation of the polyisocyanate particles to be used are primary and secondary aliphatic amines, diamines or polyamines, hydrazine derivatives, aminides, guanidines, such as for instance ethylenediamine, 1,3-propylenediamine, diethylenetriamine, triethylenetetramine, 2,5-dimethylpiperazine, methylnonanediamine, isophoronediamine, 4,4'-diamino dicyclohexyl methane, diamino and triamino polypropylene ether, polyaminoamines and mixtures of mono-, di-, and/or polyamines. The concentration of the deactivation agent should be 0.1 to 25, in particular 0.5 to 8 equivalent percent, referred to all present isocyanate groups. The polyisocyanate particles may be surface-deactivated by reaction with the deactivation agent before, during or after grinding to a particle size of for instance less than 500 μm, in particular less than 100 μm, preferably less than 50 μm.

Grinding of the polyisocyanate particles before mixing with the (binding agent) polymer takes place for instance by means of a dissolver, dispersing devices of the rotor-stator type, agitator ball mills, bead and sand mills, ball mills, or friction gap mills at temperatures of preferably less than 40° C.

The adhesive may further comprise catalysts, which control the surface deactivation or reactivation and/or the cross-linking reaction of the polyisocyanate with the polymer. Preferably, these are hydrolysis-stable catalysts that accelerate the heat-activated cross-linking reaction, such as for instance the organic tin, iron, lead, cobalt, bismuth, antimony, or zinc compounds or their mixtures known in the urethane catalysis. Preferred are alkyl mercaptide compounds of dibutyl tin. The amount of catalyst is suitably from 0.0001 to 3 wt. %, in particular 0.01 to 1 wt. %, referred to the sum of polyisocyanate and polymer.

The adhesive finally may comprise usual inert additions, such as wetting agents, organic or inorganic thickening agents, softening agents, filling agents, plastic powders, pigments, dyes, UV stabilizers, radical scavengers, corrosion inhibitors, flame retardants, propellants, and/or inert organic solvents.

A layer of an adhesive used according to the invention can be produced by that an aqueous dispersion or solution of the components described above is prepared, and is then applied on a substrate. Then takes place a removal of the water at temperatures below the reaction temperature of the polyisocyanate.

A layer of an adhesive used according to the invention may as such already have an adhesive effect. It is however essential that when heating the layer above a reaction temperature $T_r$, the isocyanate is reactivated and reacts with other functional groups in the adhesive, but in particular also in polymers, with which the adhesive is in contact, and thus forms a substance-to-substance and not easily separable connection.

By the invention, it is first achieved that electronic components or diffractive security elements are protected by the protective layers against damage during the lamination. Further, by using the latent-reactive adhesive, it is achieved that the protective layers can be integrated safely and inseparably in a security and/or valuable document, although the protective layers are formed of a base polymer, which cannot easily be laminated with the polymer layers, for instance PC.

The electronic components and/or the diffractive security element can be used quasi freestanding, or can be embedded in a core layer, and then optionally adhesive layers with a latent-reactive adhesive can be arranged between the protective layers and the core layer, too.

The core layer can be formed of a thermoplastic elastomer, in particular selected from the group comprising "olefin-based thermoplastic elastomers (TPO), mainly PP/EPDM, e.g. Santoprene, cross-linked olefin-based thermoplastic elastomers (TPV), e.g. PP/EPDM, e.g. Sarlink (DSM), urethane-based thermoplastic elastomers (TPU), e.g. Desmopan, Texin (Bayer), thermoplastic copolyesters (TPE), e.g. Hytrel (DuPont), styrene block copolymers (SBS, SEBS, SEPS, SEEPS and MBS), e.g. Septon (Kuraray) or Thermolast K (Kraiburg TPE), thermoplastic copolyamides, e.g. PEBA". However, thermoplastic polymers having a comparatively high plasticity may also be used.

The protective layers may be identical or different and may be formed of a thermoplastic elastomer, in particular selected from the group comprising "olefin-based thermoplastic elastomers (TPO), mainly PP/EPDM, e.g. Santoprene, cross-linked olefin-based thermoplastic elastomers (TPV), e.g. PP/EPDM, e.g. Sarlink (DSM), urethane-based thermoplastic elastomers (TPU), e.g. Desmopan, Texin (Bayer), thermoplastic copolyesters (TPE), e.g. Hytrel (DuPont), styrene block copolymers (SBS, SEBS, SEPS, SEEPS and MBS), e.g. Septon (Kuraray) or Thermolast K (Kraiburg TPE), thermoplastic copolyamides, e.g. PEBA." However, thermoplastic polymers having a comparatively high plasticity may also be used.

The polymer layers may be identical or different and be formed of a base polymer selected from the group comprising "PC (polycarbonate, in particular bisphenol A polycarbonate), PET (polyethylene glycol terephthalate), PET-G, PET-F, PMMA (polymethyl methacrylate), ABS (acrylnitrile butadiene styrene), PE (polyethylene), PP (polypropylene), PI (polyimide or poly-trans-isoprene), PVC (polyvinyl chloride) and copolymers of such polymers".

It is preferred that the core layer, if provided, is formed of a TPE, the protective layers are formed of a thermoplastic polyurethane, and the polymer layers are formed of a PC.

The core layer, if provided, typically has a thickness from 100 to 600 µm, preferably 200 to 400 µm. The protective layers, identical or different, typically have a thickness from 30 to 250 µm, preferably 30 to 150 µm. The polymer layers typically have a thickness in the range from 30 to 400 µm, preferably 50 to 250 µm.

One of the protective layers may have a recess, or both protective layers may have recesses.

One of the protective layers may immediately carry a printing layer on the side facing the core layer or the electronic component and/or on the side facing away from the core layer or the electronic component, on the entire surface or a partial surface, or both protective layers may each immediately carry a printing layer on the side facing the core layer or the electronic component and/or on the side facing away from the core layer or the electronic component, on the entire surface or a partial surface.

The invention also relates to a method for producing a security and/or valuable document according to the invention comprising the following steps: a1) an electronic component or a diffractive security element is provided, or a2) a core layer with embedded electronic components and/or diffractive elements is produced, b) on the core layer and/or on one side of the protective layers, optionally after imprinting at least one of the protective layers, and/or on both sides of the protective layers a latent-reactive adhesive is applied, and c) the core layer, the protective layers and the polymer layers are joined so to form a layer structure of the order "polymer layers, protective layer, electronic component and/or diffractive element or core layer, protective layer, polymer layers" and laminated with each other, said layers being heated to a temperature, which is above a reaction temperature $T_r$ of the latent-reactive adhesive. The lamination may be carried out at temperatures in the range from 100 to 230° C., in particular 170 to 210° C., for a time from 1 to 240 min, in particular 5 to 60 min, at a pressure from 0 to 400 N/cm$^2$, in particular 10 to 200 N/cm$^2$, and optionally under vacuum in the range from 2 to 1000 mbars.

In particular, the following is noted with regard to the lamination process. As a matter of principle, the step of compilation of the different polymer layers precedes the lamination process. The compilation can take place in all usual ways, continuously, quasi-continuously or discontinuously. In a so called roll-to-roll production (continuous compilation), all polymer layers, if applicable including inlay, can be guided in parallel to each other, so that only when inserting a roll, the accuracy of fit of all tracks is important. After inserting and starting, an automatic monitoring of the running accuracy of the tracks and an automatic correction is performed, so that the different polymer layers always move in a given defined position with regard to each other.

Thereafter, a lamination of the positioned tracks takes place, for this purpose the lamination of rolls being a particularly efficient and fast method. Alternatively, the lamination of single sheets (discontinuous compilation) can also be used. A single sheet has different sections of a polymer layer, which are assigned to different security and/or valuable documents, or consists thereof. Finally, document-wise individual lamination can be employed. Therein, for instance electronic circuits can be tested for operation, and printing layers can be tested for freedom of errors, and that before the respective polymer layers are compiled. Thereby, rejects are minimized, since only tested polymer layers are compiled and then joined with each other. There is no need to re-manufacture all polymer layers, if one of the polymer layers is faulty. When compiling quasi-continuously, individual layers of the polymer layer composite are joined at one position. The specialty is that the feed of roll as well as of single sheet can be made from a stack and that not only a strictly parallel, but also a crosswise operation is possible. In a further method, the compilation takes place in a combined roll-to-roll and single sheet process. Therein, the inlay can be fed as a single sheet and the further polymer layers from the roll. When joining or laminating, the different polymer layers are connected to a monolithic composite.

For the further polymer layers, the use of PC materials is preferred, and for instance for the further polymer layers in particular so called low-$T_g$ materials can be used. Low-$T_g$ materials are polymers, the glass temperature of which is below 140° C. It is preferred that the further polymer layers are formed of identical or different polymers, the base polymer of the immediately adjacent further polymer layers, comprising identical or different groups being reactive with each other, wherein at a lamination temperature of less than 200° C., reactive groups of the latent-reactive adhesive react with each other and/or with reactive groups of the further polymer layers and form a covalent bond with each other. Thereby, the lamination temperature can be reduced, without endangering thereby the tight bond of the laminated layers. This is caused by that the different polymer layers cannot easily be delaminated anymore due to the reaction of the respective reactive groups. For there is a reactive coupling, so to speak a reactive lamination, between the layers. Secondly, it is made possible that due to the lower lamination temperature the thermal load of the electronic components is reduced. The selection of the suitable reactive groups for the respective base polymers is easily possible for the man skilled in the art of polymeric chemistry. Examples for reactive groups are selected from the group comprising "—CN, —OCN, —NCO, —NC, —SH, —S$_x$, -Tos, —SCN, —NCS, —H, epoxy (—CHOCH$_2$), —NH$_2$, —NN$^+$, —NN—R, —OH, —COOH, —CHO, —COOR, -Hal (—F, —Cl, —Br, —I), -Me-Hal (Me=at least divalent metal, for instance Mg), —Si(OR)$_3$, —SiHal$_3$, —CH═CH$_2$, and —COR", wherein R may be a random reactive or non-reactive group, for instance —H, -Hal, C$_1$-C$_{20}$ alkyl, C$_3$-C$_{20}$ aryl, C$_4$-C$_{20}$ aralkyl, each being branched or linear, saturated or unsaturated, optionally substituted, or corresponding heterocycles with one or several identical or different heteroatoms N, O, or S".

Other reactive groups are of course possible. These include the reaction partners of the Diels-Alder reaction or a metathesis. The reactive groups can be bound directly or via a spacer group to the base polymer. Spacer groups include all spacer groups known to the man skilled in the art of polymeric chemistry. The spacer groups may also be oligomers or polymers, which provide elasticity, whereby the risk of breakage of the security and/or valuable document is reduced. Such spacer groups providing elasticity are well known to the man skilled in the art and therefore need not be explained here in detail. Just as examples the following spacer groups are mentioned, which are selected from the group comprising "—$(C_2)_n$—, —$(CH_2$—$CH_2$—$O)_n$, $(SiR_2$—$O)_n$—, —$(C_6H_4)_n$—, —$(C_2H_{10})_n$—, $C_1$-$C_n$ alkyl, $C_3$-$C_{(n+3)}$ aryl, $C_4$-$C_{(n+4)}$ aralkyl, each being branched or linear, saturated or unsaturated, optionally substituted, or corresponding heterocycles with one or several identical or different heteroatoms O, N, or S", with n=1 to 20, preferably 1 to 10. With regard to further reactive groups or possibilities of modification, reference is made to the document "Ullmann's Encyclopaedia of Industrial Chemistry", Wiley Verlag, electronic edition 2007. The term base polymer designates in the context of the above explanations a polymeric structure, which does not carry any reactive groups under the employed lamination conditions. These may be homopolymers or copolymers. They also include polymers modified with regard to the mentioned polymers.

In the following, the invention is explained with reference to FIG. 1 representing an example of execution only. FIG. 1 shows a diagrammatical representation of a security and/or valuable document produced according to the invention.

There is shown a core layer 3, in which electronic components 14, for instance a transponder circuit with antenna, is integrated. The core layer 3 consists of a thermoplastic elastomer, for instance olefin-based thermoplastic elastomers (TPO), mainly PP/EPDM, e.g. Santoprene, cross-linked olefin-based thermoplastic elastomers (TPV), e.g. PP/EPDM, e.g. Sarlink (DSM), urethane-based thermoplastic elastomers (TPU), e.g. Desmopan, Texin (Bayer), thermoplastic copolyester (TPE), e.g. Hytrel (DuPont), styrene block copolymers (SBS, SEBS, SEPS, SEEPS and MBS), e.g. Septon (Kuraray) or Thermolast K (Kraiburg TPE), thermoplastic copolyamides, e.g. PEBA. Further, protective layers 4,5 are provided on both sides of the core layer 3, said protective layers 4,5 being connected by two layers 6,7 of a latent-reactive adhesive with the core layer 3. The protective layers 4,5 in this example are formed of a thermoplastic polyurethane.

This composite has been laminated into further polymer layers 8, 9, 12, 13, which are formed of a polycarbonate. Between the protective layers 4, 5 and the polymer layers 9, 12, further layers 10, 11 with the latent-reactive adhesive are provided.

By using the latent-reactive adhesive, the protective layers 4, 5 in the composite system are connected in a substance-to-substance manner, so that ultimately a monolithic security and/or valuable document 2 is obtained.

Needless to mention, the core layer 3 is not essential for the invention and can also be left out without replacement. Then, in the area, where the core layer 3 is drawn, only the electronic components 14 are arranged, and the protective layers 4,5 correspondingly come closer together.

In the following, the production of an adhesive used according to the invention is described. With 106 parts by weight water, 33 parts by weight Kelzan S, 3% solution in water (Monsanto), 1 part by weight polyoxyethylene sorbitan trioleate, 2-6 parts by weight polyamine (Euretek 505, (Witco), a polyaminoamine and/or Jeffamine T-403 (Huntsman), an amino-terminated polyoxypropylene) and 80 parts by weight polyisocyanate powder (particle size smaller than 45 μm), an aqueous suspension is prepared in a dissolver. As polyisocyanate for instance the IPDI isocyanurate (IPDI-T 1890/100, Hüls) can be used. However, the other polyisocyanates mentioned above can also be used.

The invention claimed is:

1. A document (2) comprising:
    electronic components (14) and/or diffractive security elements;
    at least one protective layer (4, 5) being arranged on one side or two protective layers (4, 5) being arranged on both sides of the electronic components (14) and/or of the diffractive security element, said protective layers being formed of a first base polymer,
    polymer layers (8, 9, 12, 13), being formed of a second base polymer being different from the first base polymer, into which the electronic components (14) and/or the diffractive security element with the protective layers (4, 5) are laminated; and
    adhesive layers with a latent-reactive adhesive (10, 11) being arranged at least between the polymer layers (8, 9, 12, 13) and the protective layers (4, 5), and wherein a core layer (3) is formed of a thermoplastic elastomer.

2. The document according to claim 1, wherein the electronic components (14) and/or the diffractive security element are embedded in the core layer (3), wherein optionally also between the protective layers (4, 5) and the core layer, adhesive layers (6, 7) with a latent-reactive adhesive are arranged.

3. The document according to claim 1, wherein the core layer has a thickness from 100 to 600 μm.

4. The document according to claim 3, wherein the core layer has a thickness from 200 to 400 μm.

5. The document according to claim 1, wherein the polymer layers (8, 9, 12, 13) are identical or different and are formed of a base polymer selected from the group comprising PC (polycarbonate), PET (polyethylene glycol terephthalate), PET-G, PET-F, PMMA (polymethyl methacrylate), ABS (acrylnitrile butadiene styrene), PE (polyethylene), PP (polypropylene), PI (polyimide or polytrans-isoprene), PVC (polyvinyl chloride) and copolymers of such polymers.

6. The document according to claim 1, wherein the protective layers (4, 5) have a thickness from 30 to 250 μm.

7. The document according to claim 6, wherein the protective layers (4, 5) have a thickness from 30 to 150 μm.

8. The document according to claim 1, wherein one or more of the protective layer (4, 5) has a recess.

9. The document according to claim 1, wherein one of the protective layers (4, 5) immediately carries a printing layer on the side facing the core layer (3) or the electronic component (14) and/or on the side facing away from the core layer (3) or the electronic component, on the entire surface or on a partial surface, or both protective layers each immediately carry a printing layer on the side facing the core layer (3) or the electronic component (14) and/or on the side facing away from the core layer (3) or the electronic component (14), on the entire surface or on a partial surface.

10. The document according to claim 1, wherein the polymer layers have a thickness in the range from 30 to 400 μm.

11. The document according to claim 10, wherein the polymer layers have a thickness in the range from 50 to 250 μm.

12. The document according to claim 1, wherein one or more of the polymer layers each carry a printing layer.

13. The document according to claim 2, wherein the core layer (3) is formed of a thermoplastic elastomer selected from the group consisting of olefin-based thermoplastic elastomers (TPO), mainly PP/EPDM, cross-linked olefin-based thermoplastic elastomers (TPV), urethane-based thermoplastic elastomers (TPU), thermoplastic copolyesters (TPE), styrene block copolymers, or thermoplastic copolyamides.

14. The document according to claim 1, wherein the protective layers (4, 5) are formed of a thermoplastic elastomer selected from the group consisting of olefin-based thermoplastic elastomers (TPO), mainly PP/EPDM, cross-linked olefin-based thermoplastic elastomers (TPV), urethane-based thermoplastic elastomers (TPU), thermoplastic copolyesters (TPE), styrene block copolymers, or thermoplastic copolyamides.

15. The document according to claim 1, wherein the polymer layers (8, 9, 12, 13) are identical or different and are formed of a base polymer selected from the group group consisting of bisphenol A polycarbonate, PET (polyethylene glycol terephthalate), PET-G, PET-F, PMMA (polymethyl methacrylate), ABS (acrylnitrile butadiene styrene), PE (polyethylene), PP (polypropylene), PI (polyimide or poly-trans-isoprene), PVC (polyvinyl chloride) and copolymers of such polymers.

16. A method for producing a document (2) according to claim 1 comprising:
   a) providing one of an electronic component (14), a diffractive security element, or a core layer (3) with embedded electronic components (14) and/or diffractive elements,
   b) on the core layer (3) and/or on one side of the protective layers (4, 5), optionally after imprinting at least one of the protective layers(4, 5), and/or on both sides of the protective layers (4, 5), a latent-reactive adhesive is applied (6, 7, 10, 11), and
   c) the core layer (3), the protective layers (4, 5), and the polymer layers (8, 9, 12, 13) are joined so as to form a layer structure in the order: one or more of the polymer layers (8, 9, 12, 13); a first of the protective layers (4, 5); the electronic component and/or the diffractive element, or the core layer (3); a second of the protective layers (5 or 4); additional polymer layers (12, 13 or 8, 9), said layers being laminated with each other, and said layers being heated to a temperature, which is above a reaction temperature $T_r$ of the latent-reactive adhesive.

17. The method according to claim 16, wherein the lamination is carried out at temperatures in the range from 100 to 230° C., for a time of 1 to 240 min, and at a pressure from 0 to 400 N/cm$^2$.

18. The method according to claim 17, wherein the lamination is carried out at temperatures in the range from 170 to 210° C.

19. The method according to claim 17, wherein the lamination is carried out for a time of 5 to 60 min.

20. The method according to claim 17, wherein the lamination is carried out at a pressure from 10 to 200 N/cm$^2$.

21. The method according to claim 17, wherein the lamination is carried out under vacuum in the range from 2 to 2000 mbars.

22. A document (2) comprising:
   electronic components (14) and/or diffractive security elements;
   at least one protective layer (4, 5) being arranged on one side or two protective layers (4, 5) being arranged on both sides of the electronic components (14) and/or of the diffractive security element, said protective layers being formed of a first base polymer,
   polymer layers (8, 9, 12, 13), being formed of a second base polymer being different from the first base polymer, into which the electronic components (14) and/or the diffractive security element with the protective layers (4, 5) are laminated; and
   adhesive layers with a latent-reactive adhesive (10, 11) being arranged at least between the polymer layers (8, 9, 12, 13) and the protective layers (4, 5), and wherein the protective layers (4, 5) are formed of a thermoplastic elastomer.

* * * * *